(12) United States Patent
Liu

(10) Patent No.: US 6,509,102 B1
(45) Date of Patent: *Jan. 21, 2003

(54) TITANIUM FILM

(75) Inventor: Yinshi Liu, Monroeville, PA (US)

(73) Assignee: Honeywell International Inc., Morristown, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/365,646

(22) Filed: Aug. 2, 1999

Related U.S. Application Data

(62) Division of application No. 08/893,892, filed on Jul. 11, 1997, now Pat. No. 5,993,621.

(51) Int. Cl.$^7$ .................................................. B32B 9/00
(52) U.S. Cl. ........................ 428/450; 428/457; 428/660
(58) Field of Search ................... 204/298.12, 298.13; 148/421, 669, 670, 671; 428/660, 457, 450

(56) References Cited

U.S. PATENT DOCUMENTS

| 5,693,203 A | * 12/1997 | Ohhashi et al. |
| 5,700,519 A | * 12/1997 | Lam et al. |
| 5,798,005 A | * 8/1998 | Murata et al. |
| 5,952,086 A | 9/1999 | Ohnishi et al. |

FOREIGN PATENT DOCUMENTS

| EP | 653498 A | 5/1995 |
| EP | 0 757 116 | 2/1997 |
| JP | 5214521 | 4/1992 |
| JP | 8-232061 | 6/1996 |
| JP | 08269698 | 10/1996 |
| JP | 8-269701 | 10/1996 |
| JP | 9-25565 | 1/1997 |
| WO | WO9628583 | 3/1996 |
| WO | PCT/US98/12734 | 6/1998 |

* cited by examiner

Primary Examiner—Deborah Jones
Assistant Examiner—Jennifer McNeil
(74) Attorney, Agent, or Firm—Wells St. John P.S.

(57) ABSTRACT

Described is a titanium sputtering target to provide improved step coverage and a method of making same.

14 Claims, 6 Drawing Sheets

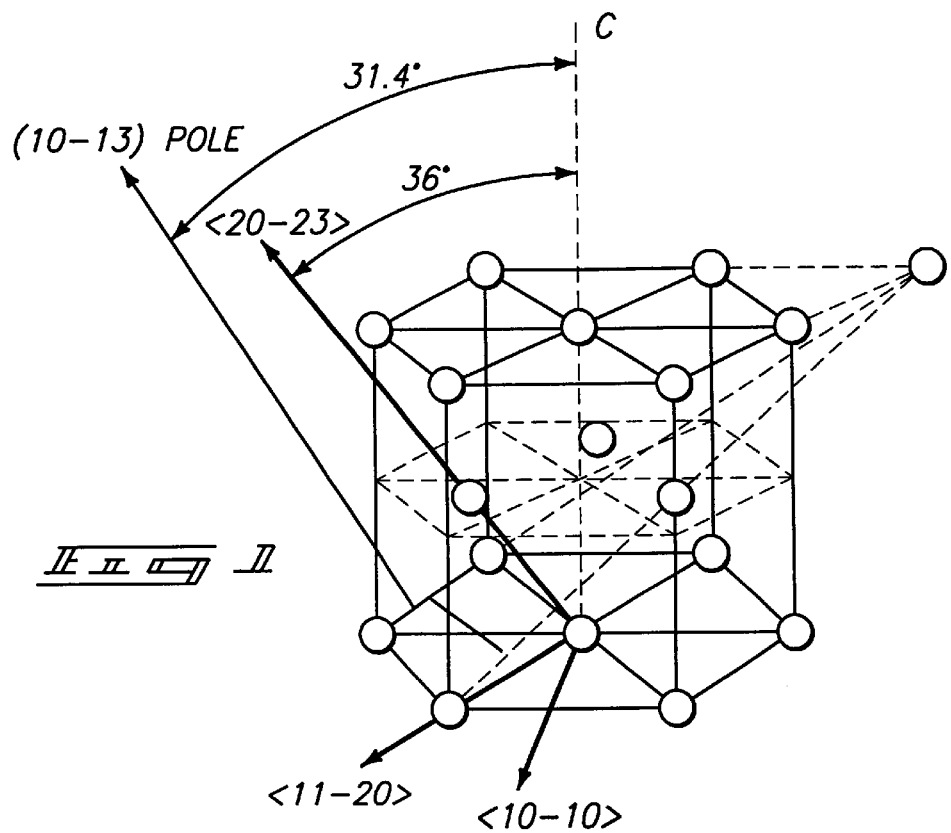
FIG. 1
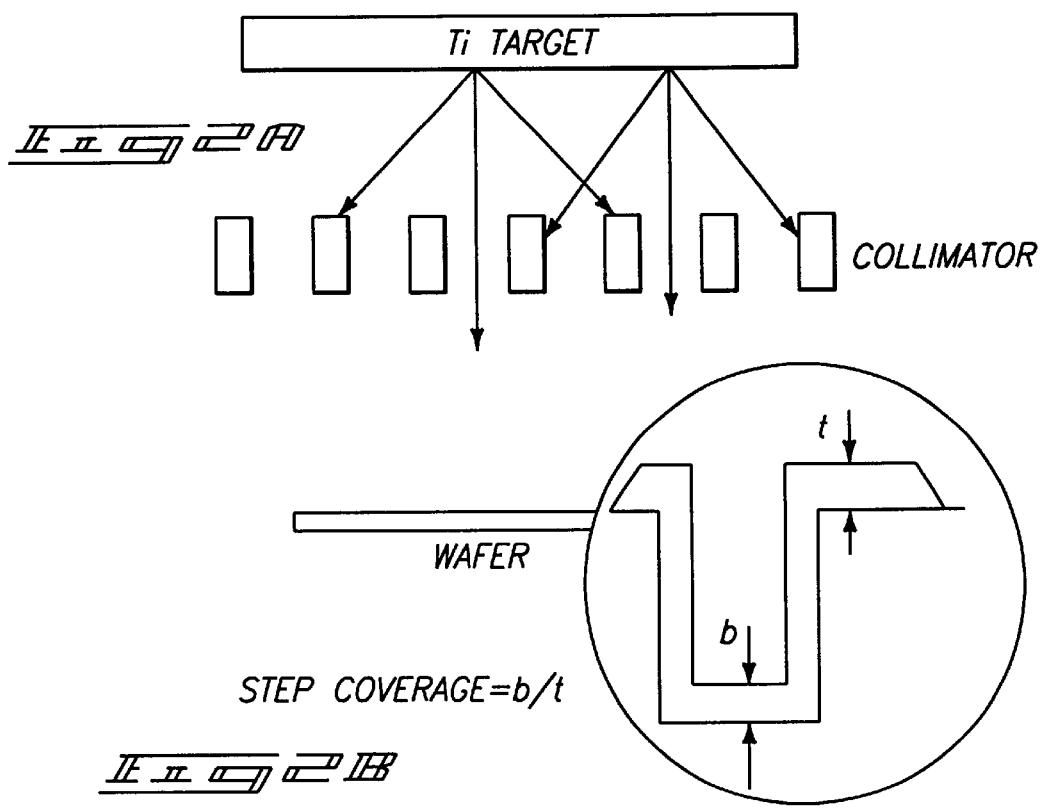
FIG. 2A
FIG. 2B

CRYSTAL TWINS

TITANIUM FILM

This application is a division of U.S. patent application Ser. No. 08/893,892, filed Jul. 11, 1997 now U.S. Pat. No. 5,993,621.

BACKGROUND OF THE INVENTION

As computer chips become "faster" and more capable, there is a corresponding increased demand for improved materials and methods of manufacturing. Although computer chips, i.e. semi-conductor devices, are manufactured by many techniques, a typical important step in the manufacture is the deposition of thin films on a substrate. The present invention focuses on physical vapor deposition, PVD, wherein a mass of metal, i.e. "a target", is shaped such that when a plasma is excited in a rarefied atmosphere, such as argon, at a very low pressure, the high speed atoms of argon dislodge metal atoms from the target. Atoms from the target thus freed, deposit a thin film on a substrate or wafer, e.g. a single crystal of silicon, located near the target. Following a number of various operations and additional film depositions, the wafer is made ready for dicing into individual chips. A few to several dozen chips may be obtained from an individual wafer. The resulting chips provide various functions in a typical computer, for example, memory, logic and application specific tasks, etc.

Articles embodying the chips are often made by designs that include trenches, contact holes and via holes (also referred to as "vias") in very small diameters. It is important that the film coverage of the bottom of the contact holes, vias, and trenches, referred to as "step coverage", be maintained to a useful degree so that smaller diameters of such holes can be used as higher aspect ratios are desired in applications where electrical connection between layers is required. The present invention provides a titanium sputtering target which enables improved step coverage.

SUMMARY OF THE INVENTION

In accordance with the present invention there is provided a titanium sputtering target that has particular texture with high fractions of <20-23> and <11-20> orientations perpendicular to target plane. The texture may be defined by intensities for various crystal planes that are parallel to the target plane. A value of intensity for a crystal plane in a textured target is expressed as multiples of the intensity for the same crystal planes in a Ti sample with a random grain orientation distribution. Intensities of crystal planes are obtained from orientation distribution function based on four measured pole figures from X-ray diffraction.

In addition, the invention concerns a method of providing a titanium sputtering target with particular desired orientation and texture, and titanium sputtering targets that are especially useful in physical vapor deposition processes to improve step coverage.

BRIEF DESCRIPTION OF THE DRAWINGS

FIG. 1 is a diagram of crystal structure and orientations of Ti;

FIGS. 2A and 2B are diagrams showing a sputtering target and collimator to attempt to improve step coverage, with an inset that explains "step coverage";

DETAILED DESCRIPTION OF THE INVENTION

Figure 3:
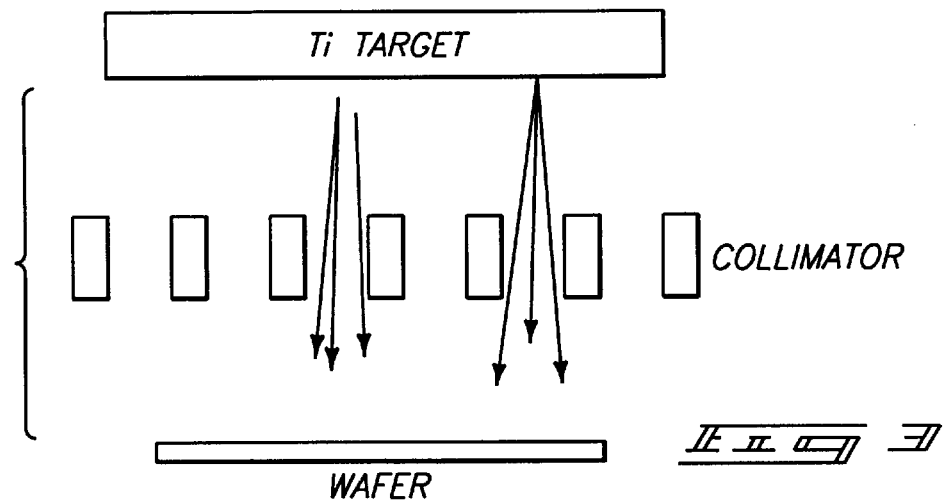
FIG. 3 is a diagram that illustrates improvement in step coverage or collimation yield by using a target with higher proportion of perpendicular emission.

An important aspect of chip manufacture is the purity of the material. A method and apparatus for producing very high purity titanium, and high purity titanium so produced. are disclosed in copending application filed Apr. 30, 1997 in the name of Harry Rosenberg, Nigel Winters and Yun Xu, entitled Method and Apparatus for Producing Titanium Crystal and Titanium, application Ser. No. 08/846,289, the disclosure of said application is hereby expressly incorporated herein by reference. The disclosure Ser. No. 08/846, 289 describes formation of titanium materials having a purity of 99.9999% and 99.99999%. The disclosure of Ser. No. 08/846,289 also describes formation of titanium materials having less than 50 parts per million oxygen; as well as formation of titanium materials having less than 30 parts per million oxygen.

Conductivity and chip speed of semi-conductor devices, using titanium depend on titanium purity, especially the oxygen content. Other important impurities to minimize or exclude include: radioactive elements (alpha emission can cause a memory element to change state), transition metals, e.g. Fe, Cr, Ni, (lowering amounts of these improve etching and element registry) and alkali metals, e.g. Na and K, that can migrate to transistor elements and disrupt their function. Thus titanium targets must be as pure as possible in both metallic and gaseous elements for maximum usefulness and advantageously should have no defects such as oxide or nitride inclusions. However, texture of the sputtering target is important to establish the direction of atom emission from the target and is dependent on crystallographic orientations. FIG. 1 illustrates the crystal structure and orientation of alpha phase titanium.

As the quality of semi-conductor devices improve, smaller line geometry and higher aspect ratio contact and via holes are required in chip manufacture. In order to deposit thin, uniform films in contact and via holes with high aspect ratio, it is necessary to direct the flux of atoms being ejected from the target as perpendicular to the wafer as possible. Ideally, the deposited film thickness would be the same on the wafer surface as it is at the bottom of a via or a contact hole. The ratio of these thicknesses is often referred to as step coverage which is explained in the inset in FIG. 2.

The vast majority of atoms strike the wafer at various and lower angles, thereby coating the surface and sidewalls of the via or the contact hole. In this case, the film on the surface and sidewalls may become so thick as to close off the via or the contact hole, preventing proper film thickness from being obtained at the bottom of the via or the contact hole. However, by collimator as shown in FIG. 2 the atoms can be better directed to the wafer but the yield is reduced because of deposition on the collimator. Current sputtering target designs have textures that result in a much wider flux distribution, yielding only a small population of atoms that are collimated enough to be deposited in the bottom of a via or a contact hole.

Although mechanical collimators are somewhat effective in improving step coverage, they present several difficulties in their use. The sputter yield is significantly reduced due to coating of the collimator because only those Ti particles that travel in directions approximately perpendicular to the wafer surface are allowed to reach the wafer during the collimated sputtering. Usually, the collimator becomes so heavily coated that it must be removed and replaced with a new one at least once during the target's life. Replacing the collimator results in costly downtime.

The emission direction of sputtered atoms is preferably along certain crystallographic orientations from a target. Therefore one effective way to increase collimation yield (efficiency) or step coverage is to tailor the crystal orientation distribution, i.e. crystallographic texture, of polycrystalline target so that a higher proportion of the atoms is emitted in a direction perpendicular to the wafer surface. Since atoms emit preferably along certain crystallographic directions, sputtering performance such as step coverage and collimation yield (efficiency), is dependent on crystallographic texture in the targets. Textures in Ti targets are mainly determined by initial texture prior to processing, metal working, and annealing conditions for high purity Ti.

FIG. 3 illustrates that a target with properly designed texture may be used with a mechanical collimator to achieve collimation of the atom flux. The collimator may be made of titanium in a "honeycomb" configuration, with dimensions designed for the level of step coverage desired.

Figure 4:
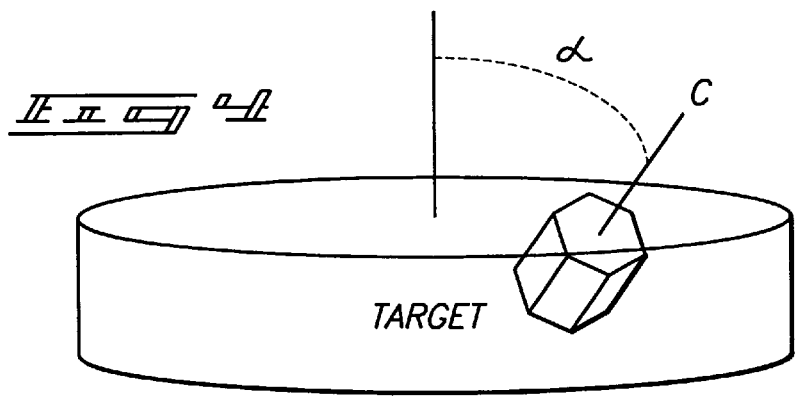
FIG. 4 Illustrates the (0002)-α texture.

Alpha titanium has a hexagonal close packed crystal structure at temperatures below about 880° C. with crystal orientations shown in FIG. 1. A Ti target produced by cold rolling or forging over 50% deformation followed by annealing for recrystallization has a texture of (0002)-α (typically α=20°–34°), where α is the angle between (0002) crystal plane and the target plane (FIG. 4). The angle α is dependent on initial texture, metal working method, amount of deformation, temperature during the deformation, and heat treatment. A texture with (10-13) or (10-15) as the strongest component is often obtained after cold rolling followed by recrystallization. The notation "( )" enclose the Miller Bravais indices for atomic planes in hexagonal materials.

Sputtered atoms preferentially emit along near-neighbor directions. In this description "< >" encloses (identifies) Miller Bravais indices for direction in a hexagonal crystal. The direction of nearest neighbor for Ti is <20-23> which is the direction from an atom in one close-packed crystal layer to its nearest neighbors in the adjacent close-packed layers. However, atoms do not align by the nearest neighbor distance continuously along this direction, but align alternatively With short and very long spacings as show in FIG. 1. The second near-neighbor direction in Ti is <11-20> which is also a close-pack direction with an equal atomic spacing. Therefore, it can be concluded that the <20-23> and <11-20> are the preferred directions of emission for Ti during sputtering.

The highest step coverage and collimation efficiency is expected to occur for polycrystalline targets having textures with high proportions of <20-23> and/or <11-20> orientations perpendicular to the wafer surface. Therefore, it is preferred to have a texture in one of these two orientations or in both these orientations at once. This invention involves high purity Ti targets with high fraction of <20-23> perpendicular to the target plane. or high fraction of both <20-23> and <11-20> perpendicular to the target plane.

Metals crystallize in various crystal systems and physical properties for pure metals usually depend on the direction in which they are measured. Physical properties of titanium (and metals generally) are described by tensors. Physical properties include paramagnetic and diamagnetic susceptibility, electrical and thermal conductivity, stress, strain, thermal expansion, piezoelectricity, elasticity, thermo electricity and optical properties. Each of these properties can be calculated. All metals therefore exhibit physical properties controlled and defined by crystallographic texture and grain size distributions and rarely are these isotropic. Titanium physical properties are all anisotropic; thus the direction effect can be significant. The elastic modulus of titanium, for example, can vary by as much as three-fold in single crystal, depending on the temperature and direction of measurement. Metallurgical factors affecting the physical properties of titanium include purity, texture, grain size, lattice defects of various sorts and the distributions and uniformities of same. Physical properties depend expressly on, and are entirely controlled by, the metallurgical characteristics described herein.

The various slip and twinning systems can be expressed as vectors that involve a direction and displacement. Each mode of deformation has a critical stress that depends on temperature and direction of measurement. Therefore, mechanical properties are also controlled and defined by the metallurgical condition of titanium. Flow stress, ductility and fracture toughness, and how each is affected by the temperature of measurement, are examples of mechanical properties. Physical transport properties such as inter diffusion of matrix and impurities are governed by the respective ease of atomic jumps in various lattice directions and not all jump directions are equally easy and they are always associated with a specific vector. Grain size and texture are important since they combine to form a distribution of grain boundary mismatch contributing more or less significantly to pipe diffusions for example. These properties also depend expressly on the metallurgical condition.

The present invention contemplates titanium targets with tailored textures that provide better step coverage or higher yield (efficiency) of mechanical collimation and methods for manufacturing these targets. Better step coverage and higher collimation yield (efficiency) are achieved through increased proportion of atom emission perpendicular from the target surfaces during sputtering. Such controlled emission provides better step coverage and collimation efficiency and results in a computer chip having improved step coverage on the contact and via holes, regardless of the hole aspect ratio.

Figure 5:
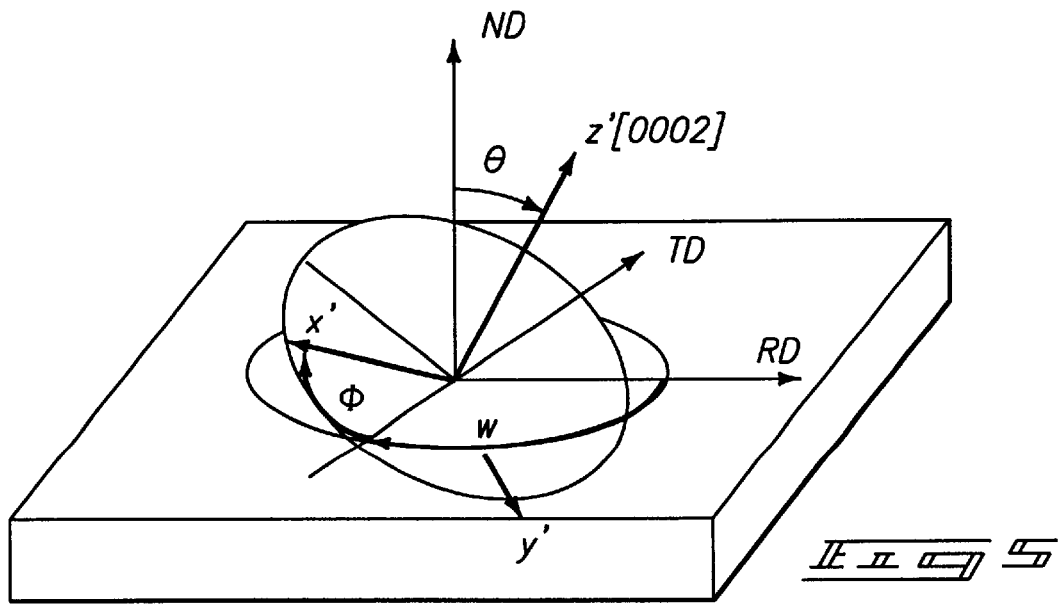
FIG. 5 illustrates definition for Euler angles.

The texture requirement for the titanium target capable of a high proportion of Ti emissions perpendicular to the target surface is based on intensities for (hkil) crystal planes that are parallel to the target plane, which will be referred to as intensity of (hkil) hereinafter. An intensity for a crystal plane is proportional to the volume fraction of all the grains that are orientated with this crystal plane parallel to the target plane. A value of intensity for (hkil) plane in a Ti target is expressed as multiples (times random) of the corresponding intensity in a Ti sample with a random grain orientation distribution, and is obtained from orientation distribution function based on four measured pole figures from X-ray diffraction:

$$dV/V = I(\theta,\Phi)dy, \text{ in which } I(\theta,\Phi) = 1/(8\pi^2)\int f(\omega,\theta,\Phi)d\omega, \text{ and } dy = \sin\theta d\theta d\Phi$$

where $\omega, \theta$, and $\Phi$ are Euler angles according to FIG. 5; $I(\theta,\Phi)$ is the intensity for (hkil) plane parallel to the target plane; dV is the volume element corresponding to the orientation element dy for the entire sample; V is the total volume of the sample; "$\int$" represents integration from 0° to 360° with respect to $\omega$; and $f(\omega,\theta,\Phi)$ is the orientation distribution function constructed from experimental pole figures. The ND, RD, and TD in FIG. 5 are axes of the coordinate system attached to the sample (sample coordinate system), and represent normal direction (perpendicular to the target plane), rolling direction, and transverse direction of the target, respectively. The x', y', and z' are axes of the coordinate system attached to the crystal (crystal coordinate system) with z' along [0002] direction which is the pole of (0002) plane. The Euler angles $\omega, \theta$, and $\Phi$ are defined by the following operations. The crystal coordinate system initially coincides with the sample coordinate system, that is, x', y', and z' coincide with RD, TD and ND, respectively. The crystal coordinate system is then first rotated about the z'-axis through the angle $\omega$, then about x'-axis (in its new orientation) through $\theta$ and finally, once again about the z'-axis (in its new orientation) through the angle $\Phi$.

Figure 6A:
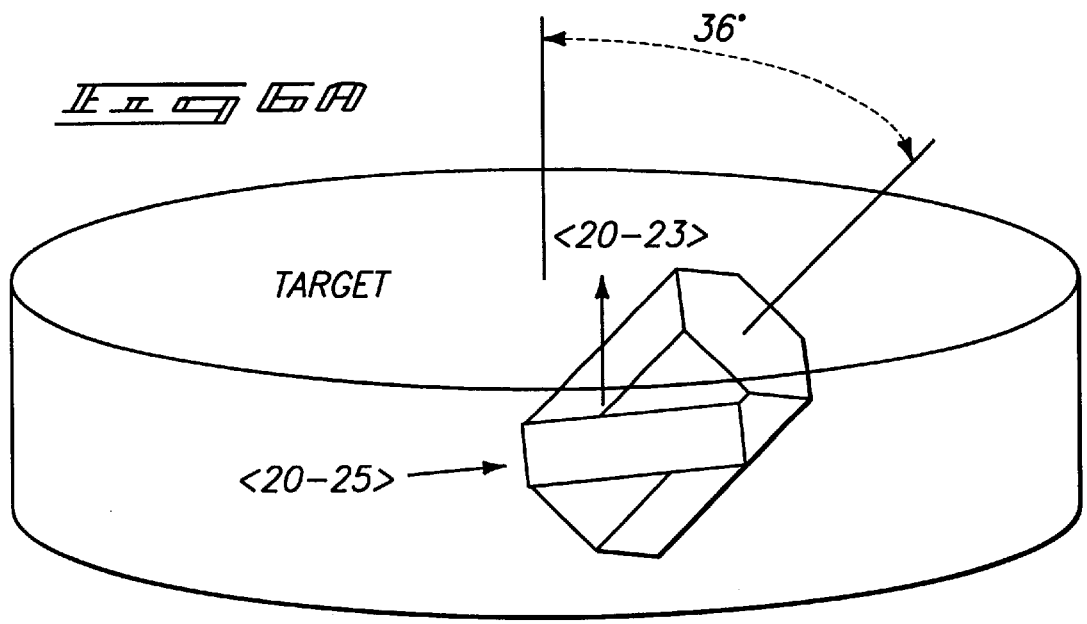
FIG. 6A is an illustration of the (20-25) texture.
Figure 6B:
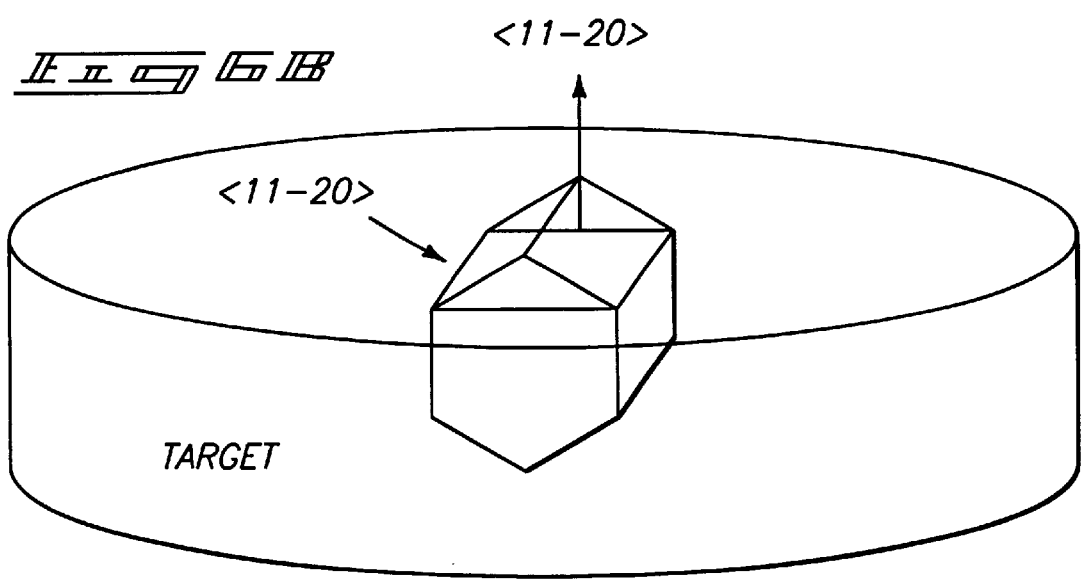
FIG. 6B is an illustration of the (11-20) texture.

An intensity value in terms of times random for (hkil) can be understood as a calculated X-Ray diffraction intensity from the (hkil) parallel to the target plane scaled to that of a random sample. Since a pole of a crystal plane is perpendicular to this crystal plane, an intensity for (hkil) plane parallel to the target plane can also be considered as the pole intensity of (hkil) perpendicular to the target plane. For example, <20-23> and <11-20> are the poles of (20-25) and (11-20) planes. Therefore, the intensities of (20-25) and (11-20) also represent intensities of <20-23> and <11-20>, respectively. Unlike plane and direction indices (Miller) in cubic crystals, planes and directions in hexagonal crystals do not always share the same indices (Miller-Bravais). Only for basal or prism planes, do Miller Bravais direction and plane indices coincide numerically. The <20-23> and <11-20> orientations are perpendicular to the target plane when the crystal plane (20-25) and (11-20) are parallel to the target plane, respectively (FIG. 6). Therefore, textures with <20-23> and <11-20> perpendicular to the target surface are referred hereinafter as (20-25) texture in FIG. 6A and (11-20) texture in FIG. 6B, respectively. Because some crystal planes such as (20-25) do not have or have extremely weak X-Ray diffraction peaks, the intensities of crystal planes are calculated from orientation distribution function constructed from four measured pole figures for (0002), (10-11), (10-13), and (11-20) rather than measured directly in the X-ray diffraction. A strong (20-25) texture corresponds to (0002)-36° texture (average peak intensity being at 36° from the center of (0002) pole figure).

The expression (0002)-$\alpha$ represents a texture such that (0002) planes have an average tilt angle of $\alpha$ relative to the target plane to be sputtered. It is calculated by averaging the tilt angles of highest five intensity peaks on a (0002) pole figure according to the following equation:

$$\alpha = \Sigma I_i \alpha_i / \Sigma I_i$$

where $\alpha_i$ and $I_i$ are the (0002) tilt angle relative to the target plane for ith intensity peak and the corresponding X-Ray intensity, respectively.

The following discussion explains the correlation between the crystallographic textures and sputter performance including step coverage.

Figure 7:
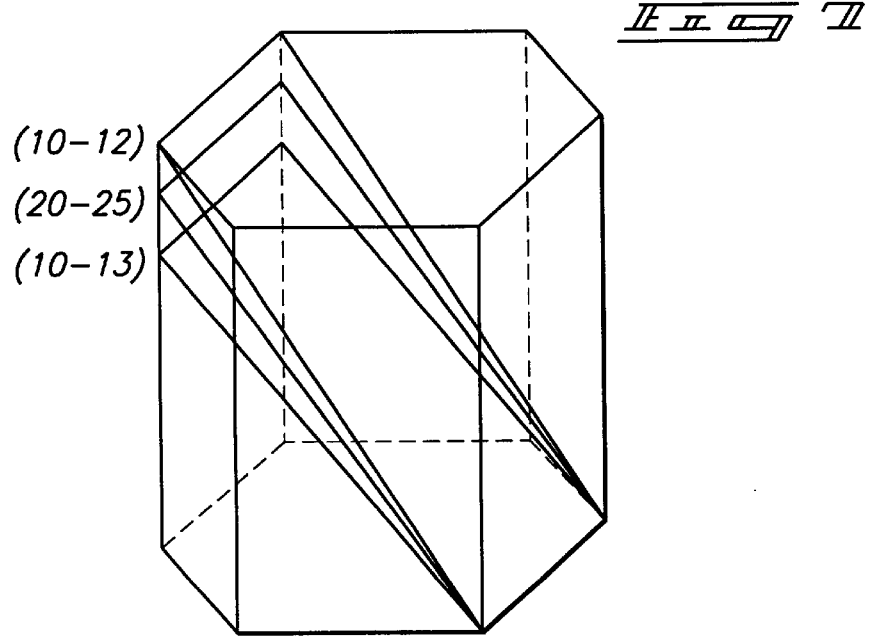
FIG. 7 is a diagram showing the relationship of (10-12), (10-13), and (20-25) planes.

In order to obtain a high proportion of Ti emission directions perpendicular to the target surface, high proportions of grains should be oriented with (20-25) and/or (11-20) planes parallel to the target surface as shown in FIGS. 6A and 6B. According to this invention, the following crystallographic texture is preferred. The intensity of (11-20) parallel to the target plane is preferably greater than 0.4 times random and the intensity of (20-25) plane parallel to the target plane is at least 1.5 times random. In order to maximize (20-25) intensity, an average tilt angle of (0002) with respect to the target surface plane, is preferably between about 32° and 40°. The most desirable $\alpha$ value is about 36°. The (20-25) is sandwiched between (10-12) and (10-13) (FIG. 7). Since (20-25) is only approximately five degrees from these two crystal planes, high intensity of (10-12) and (10-13) should also be helpful in step coverage improvement. This requires high summation of intensities for (20-25), (10-12), and (10-13). Since (0002) is as far as 36 degrees from (20-25) and 90 degrees from (11-20), Ti emission is significantly away from the direction perpendicular to the target plane for strong (0002) texture. It is therefore desirable to have very low intensity of (0002) parallel to the target plane. This invention provides targets in which the intensity of (0002) parallel to the target plane is 1.8 times random or less, and preferably less than 1.0 times random.

Figure 8A:
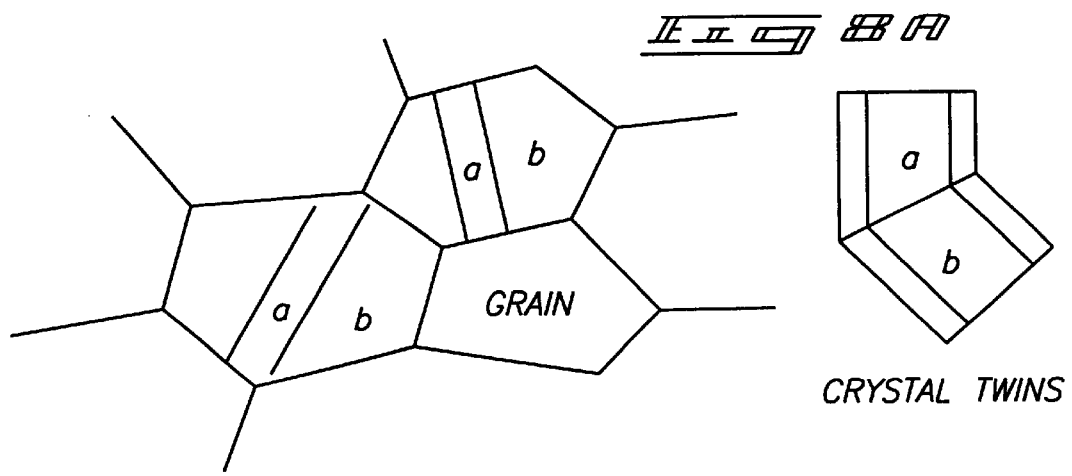
FIG. 8A is an illustration of grains with twins. The area marked a is a twin of b and vise versa because they have twin orientation relationships.
Figure 8B:
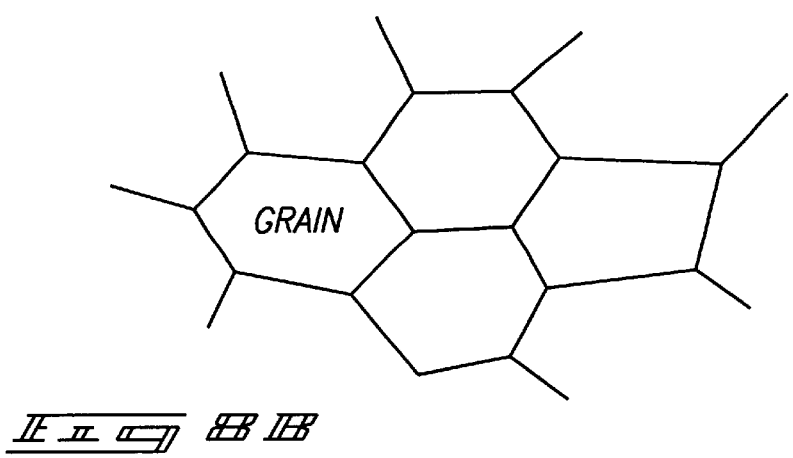
FIG. 8B is an illustration of grains that are recrystallized.
Figure 9A:
FIG. 9A is a photomicrograph of a target surface showing microstructure with twins.
Figure 9B:
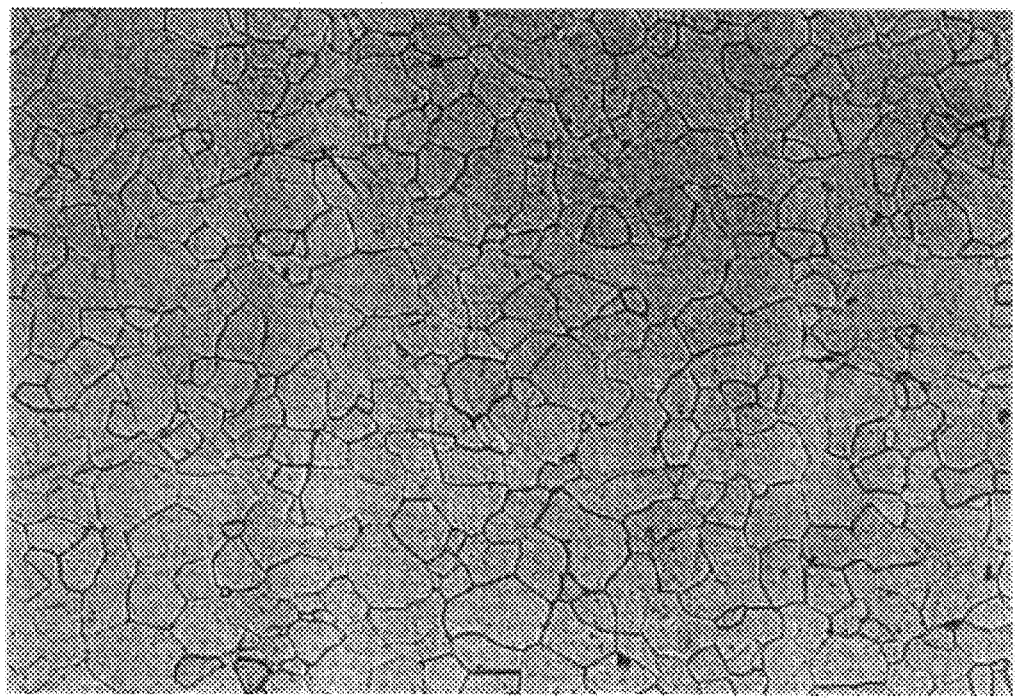
FIG. 9B is a photomicrograph of a target surface showing microstructure with recrystallized grains.

Two types of microstructure may be produced in the targets of this invention, and the texture obtained is dependent on the microstructure. The first type of microstructure contains uniformly distributed twins. The fraction of twins is defined by the area fraction of grains that contain twins in a cross-section of a sample. The fraction of twins can be controlled and up to 100% twins is obtainable. The second type of microstructure contains recrystallized grains. FIGS. 8A and 8B illustrate grain and twins diagrammatically and FIGS. 9A and 9B are photomicrographs showing twins and grains, respectively. Higher intensity of (11-20) parallel to the target plane is achievable with the twinning microstructure than with the crystallized microstructure. Greater than 1.5 times random for (11-20) parallel to the target plane can be obtained with the twinning microstructure. On the other hand, the recrystallized microstructure is associated with higher total intensities for (20-25), (10-12), and (10-13) parallel to the target plane. The intensity of (20-25) parallel to the target plane may be greater than three times random for the recrystallized microstructure. Also lower intensity of (0002) parallel to the target plane is achievable with the crystallized microstructure than with the twinning microstructure. As low as 0.3 times random for (0002) parallel to the target plane is achievable with the recrystallized microstructure. Grain size as small as 10 $\mu$m is attainable and grain size as small as 5 $\mu$m is desirable.

The targets of the invention are distinguished from conventional targets in that (a) the targets in this invention have high intensity in the vicinity of (0002)-$\alpha$ ($\alpha$=30°~40° which contain strong (20-25)) and (11-20); (b) texture component of (0002) is much reduced; (c) uniformly distributed twins in microstructure associated with high (11-20) texture component; and (d) the targets provide better step coverage or collimation yield than the conventional targets.

Figure 10:
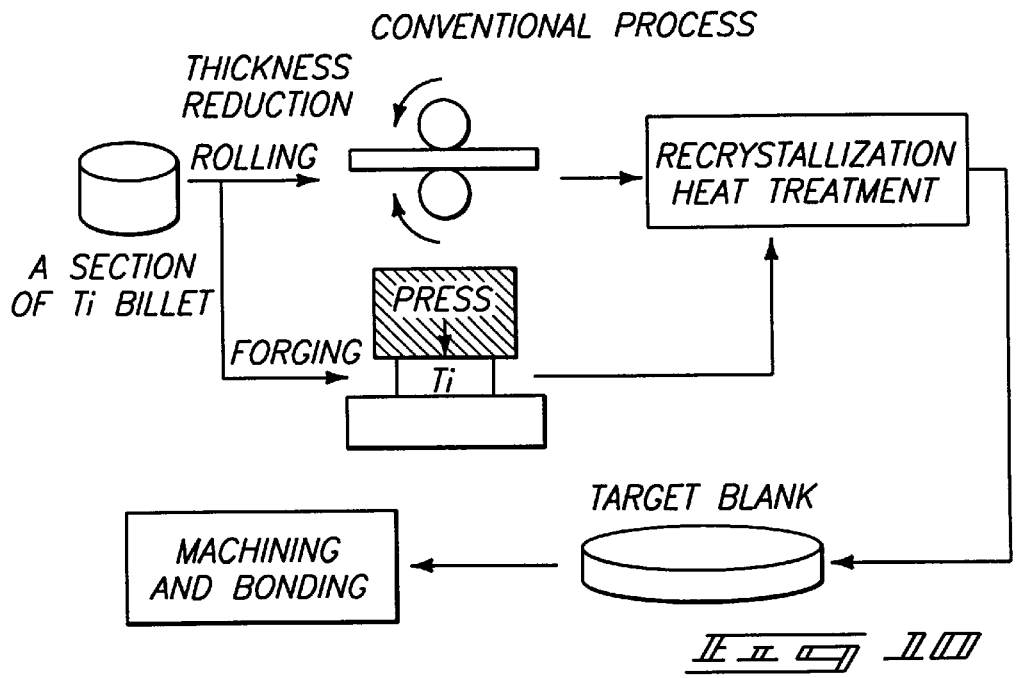
FIG. 10 is a flow chart showing conventional target manufacturing process.

Since texture produced by conventional mechanical deformation, e.g. rolling and forging, spreads from (10-17) to (10-13) which is close to (20-25) texture but far away from (11-20) texture, processing methods other than conventional methods shown in FIG. 10 must be used. The processing method for forming the desired textures is described as follows, but it should be understood that other procedures for working Ti may be used to effect the same goal. For example, different types of forging, rolling, and other metal working processes may be used with equal effect, providing metal working sequences are used that activate deformation in the work piece to become a target in ways that take advantage of the slip and twinning components of deformation. The invention contemplates using standard metal working but in a new process to attain these desirable textures.

Figure 11:
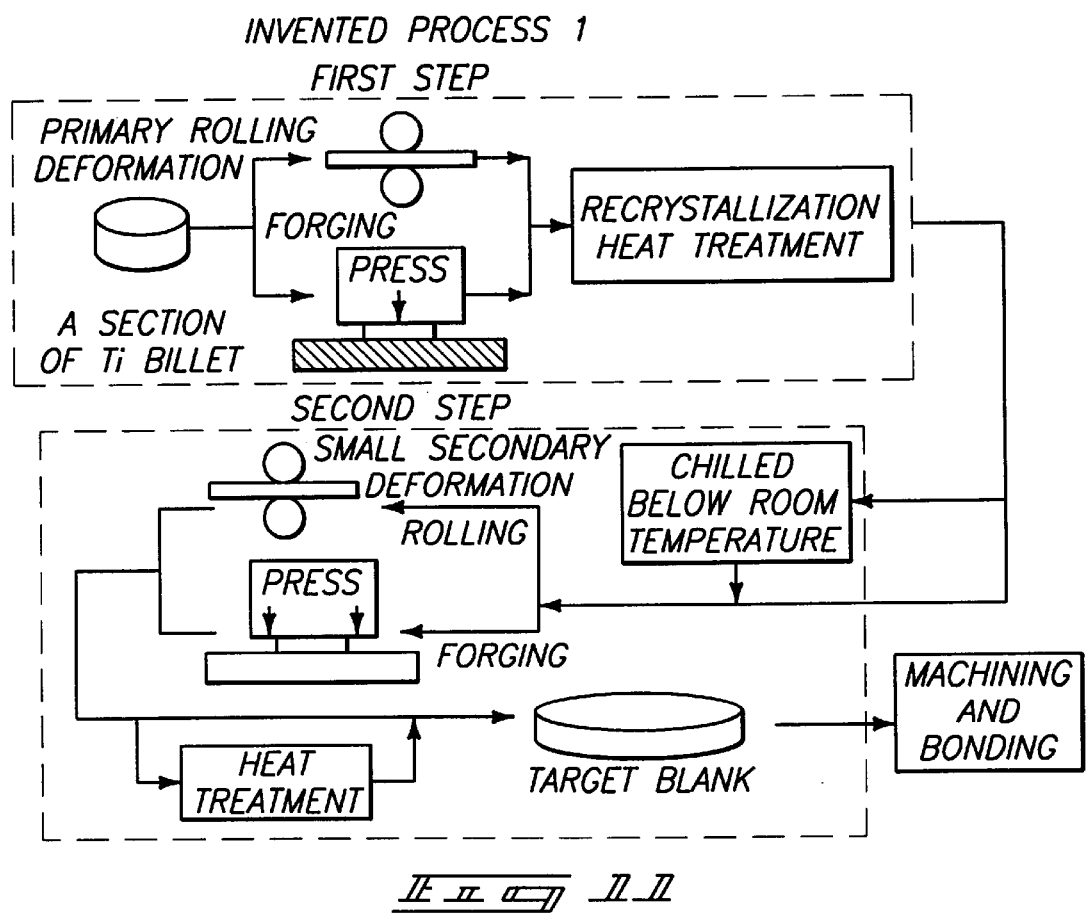
FIG. 11 is a flow chart illustrating an example of how a sputtering target may be made in accordance with the invention.

One such method used to obtain a texture of this invention involves producing the finished texture by arranging the deformation schedule with twinning as the dominant deformation mechanism during finishing deformation steps as opposed to slip being the dominant deformation mechanism as in conventionally processed Ti target. Significant grain rotation can be obtained through twinning with small amounts of deformation. FIGS. 10 and 11 compare conventional processing and the processing to produce oriented targets to maximize step coverage according to the invention. The flow chart in FIG. 11 illustrates one process but it may be also possible to obtain desired orientation by other processes. As used here the term deformation refers to a procedure that results in a reduction in cross sectional area or reduction in thickness.

The first processing step of this method includes a mechanical deformation and annealing for recrystallization. Much of the mechanical deformation is achieved in the first processing step, ("primary deformation"). However, the deformation process in this step should be performed in the alpha phase field at any temperature. A cold deformation, especially cold rolling, is preferred for better uniformity and a sharper texture. In the primary, or first, deformation a high purity titanium billet receives a thickness reduction of more than 50%, preferably more than 70%. The deformed blanks are then heat treated to obtain a recrystallized microstructure with a strong $(0002)$-$\alpha_1$ texture. The subscript 1 denotes the result after first process step. The tilt angle $\alpha_1$ is dependent on the metal working process and heat treatment. It is usually 20~34°, and typically 30°, when the target blank is rolled more than 70%.

In the second processing step of the method in this invention, the blanks are subsequently deformed again, such as by rolling or forging, with a thickness reduction between about 5% and 30%, preferably between about 10% and 20%. This second deformation step results in a texture with two main components, $(0002)$-$\alpha_2$ and $(11\text{-}20)$; the subscript 2 refers to the tilt angle $\alpha_2$ observed after the second deformation. The tilt angle $\alpha_2$ is usually two to six degrees higher than $\alpha_1$ depending on the amount of second deformation and temperature. The difference between $\alpha_2$ and $\alpha_1$ increases with decrease of the temperature of the second deformation and increase in the amount of second deformation. It is preferred that the second deformation step be performed cryogenically although deformation at ambient temperature is acceptable.

A cryogenic rolling followed by hot rolling below recrystallization temperature, can generate higher intensity of $(11\text{-}20)$ parallel to the target plane after recrystallization than cryogenic rolling alone. The total thickness reduction (in reference to the thickness at start of the cryogenic rolling) is preferably less than 35%.

A target manufactured by this method can have as-deformed or recovered twinning, or partially recrystallized microstructure with reduced fraction of twins, or fully recrystallized microstructure without twins. Recrystallization does not change the as-deformed tilt angle, $\alpha_2$ significantly. As a result of recrystallization, fraction of grains with orientations around $(0002)$-$\alpha_2$ is increased but the fraction of $(11\text{-}20)$ parallel to the target plane is decreased. Also, an extremely low fraction of $(0002)$ parallel to the target plane is obtained, which is preferred. Target texture after a recovery heat treatment remains essentially the same as the starting texture with twinning microstructure. The grains with twinning microstructure may be defined by twin boundaries which are grain boundaries of special orientations. A grain size below 20 microns is preferred after the heat treatment in the first process step if the twin microstructure remains as the microstructure in the final product. This will generate lower fractions of $(0002)$ parallel to the target surface, which is desired for better step coverage.

The primary deformation process (i.e. first deformation step) in this invention is used to obtain an uniform and small grain size, and to obtain the majority of total thickness reduction required. The primary deformation, after forging an ingot to a billet, can be rolling and/or upset forging but is not limited to these methods. The target blank should be recrystallized after the first deformation process for the maximum amount of twinning during the second deformation. The secondary deformation, i.e. the second deformation, is used to create significant amount of $(11\text{-}20)$ and to change a angle through twinning. The method of deformation can be rolling and/or forging, or any method that generates equivalent effect in twinning and rotating grains toward $(11\text{-}20)$. The deformation should be between about 5% and 30%, preferably between about 10% and 20% so that twinning instead of slip is the dominant deformation mechanism. When the second deformation is below about 5%, the amount of deformation is too small to cause significant change in texture. When the second deformation is more than about 30%, a higher fraction $(0002)$ parallel to the target plane is obtained. The amount of twinning and $(11\text{-}20)$ should be maximized in the second deformation by different ways including low deformation temperature such as cryogenic deformation, higher deformation rate, and larger grain size. Cryogenic deformation is preferred in the second deformation although deformation under ambient temperature can also generate significant twinning. Twinning is more dominant at cryogenic temperatures than at ambient temperature. The cryogenic deformation also provides a more uniform twin microstructure than deformation at ambient temperatures. Before the cryogenic deformation, a Ti blank may be chilled to a temperature as low as convenient or desired. Titanium is quite ductile at cryogenic temperatures. especially when it is high purity. The preferred methods of deformation are rolling, forging or other processes that produce the similar result. A grain size of smaller than 20 micron after the first process (combination of first deformation and heat treatment) is desirable for lowest intensity of $(0002)$ after the second deformation. A smaller grain size after the first process will also result in a smaller grain size in the final product which is desired for good film uniformity.

Preferably, a strong $(0002)$-$\alpha_1$ texture with $\alpha_1$ between 30 and 40 degrees should be obtained after the first process (combination of deformation and heat treatment) so that a texture containing $(0002)$-$\alpha_2$ in the vicinity of $(0002)$-36° and significant fraction of $(11\text{-}20)$ is obtained after the second deformation. Ideally, more than 70% rolling reduction in the first processing step is applied so that a cryogenic deformation such as rolling or forging in the second deformation generates a texture with both strong $(0002)$-36° and $(11\text{-}20)$ compositions.

The minimum grain size after recrystallization of the twins is usually larger than the grain size before twinning. Therefore, various grain size can be obtained by controlling both process steps. A grain size above 15 μm can be obtained in the final product after the dual process or a finer grain size may be obtained if desired for good thin film uniformity. The most effective way of reducing grain size is refining grain size in the first deformation step. A grain size of 5 μm or smaller is achievable through severe deformation prior to the first deformation (on an ingot) and on the billet in the first deformation step, such that a grain size between 5 and 15 μm can be obtained in the final product. A grain size smaller than 5 μm is achievable in the target with the new texture if the grain size is less than about 2 μm after the primary deformation and heat treatment.

The rolling method used in the primary and second deformations can be either unidirectional or cross rolling. In unidirectional rolling, the rolling passes are along the same direction. In cross rolling, the rolling passes are along different directions. Ideally, cross rolling is performed in rolling-pass-pairs and a rolling pass in each pair is followed by a second pass at 90 degrees such that the original shape or outline is restored.

The following example, summarized in Table 1, compares the described processing represented by samples No. 1 and 2 with processing examples No. 3 through 6 in accordance with the invention. Table 2 summarizes purities. Grin size and texture of these samples. The values associated with crystal planes in Table 2 are intensities in terms of times random. The tilt angle of (0002) is averaged angle between (0002) plane and the target plane calculated by averaging five highest intensity peaks on (0002) pole figures.

The processes described below started from a cylindrical billet which was forged from a cylindrical cast ingot at 815° C. for 70% deformation along the radial directions.

The composition of the samples used in the examples are described in Tables 3, 4, 5 and 6. Tables 3 and 4 indicate the chemistry of ingots from which Sample No. 1 and sample No. 2. respectively, were derived. Table 5 indicates the chemistry ingot from which Samples 3 and 4 were taken and Table 6 describes the chemistry of an ingot from which Samples 5 and 6 were derived. The GDMS analysis method was used to determine concentration of all elements other than S, H, C, N and O, which were analyzed by the LECO method.

Sample No.1: A section of billet was cold worked to 80% deformation by cross rolling in directions 45° apart, and then annealed at 760° C. for 75 minutes. The dominant texture in this sample is (0002)-11° which has high intensities at (0002) and (10-17). There is negligible intensity of (11-20)

Sample No.2: A section of a billet was cold worked to 80% deformation by cross rolling in directions 45° apart, and then annealed at 510° C. for 120 minutes. The strongest texture component in this sample is (10-13) accompanied by higher intensity of (20-25) and lower intensity of (0002) than sample No.1. There is negligible intensity of (11-20) in this target as for sample No.1.

Sample No.3: A section of billet was cold worked to 80% deformation by cross rolling in directions 45° apart, and was then recrystallized at 565° C. for 30 minutes. It was subsequently processed by cryogenic cross-rolling comprising two perpendicular passes at −73° C., with further 15% reduction in thickness (in reference to the finishing thickness of the cold rolling). The cryogenically rolled sample was heat treated at 427° C. for 30 minutes, which brought about recovery only. The heat-treated sample has significant intensity peaks at both (11-20) and (20-25), and contains more than 95% twins. This process also generated weaker (0002) intensity.

Sample No.4: A section of billet was cold worked to 80% deformation by cross rolling in directions 45° apart, and was then recrystallized at 621° C. for 30 minutes. It was subsequently processed by cryogenic cross-rolling comprising two perpendicular passes at −73° C., with further 15% reduction (in reference to the finishing thickness of the cold rolling). The cryogenically rolled sample was heat treated at 635° C. for 60 minutes, which brought about recrystallization. The heat-treated sample has a stronger intensity of (20-25) than sample No.3. It also has much reduced intensity of (0002) compared to samples No.1 through No.3. There a lower intensity of (11-20) in this target than in sample No.3 due to recrystallization.

Sample No.5 A section of billet was cold worked to 75% deformation by cross rolling in directions 45° apart, and was then recrystallized at 593° C. for 45 minutes. It was subsequently processed by cryogenic cross-rolling comprising two perpendicular passes at −48° C., with further 14% reduction (in reference to the finishing thickness of the cold rolling). The cryogenically rolled sample was heat treated at 704° C. for 60 minutes, which brought about recrystallization. This target has intermediate intensity of (11-20), relatively strong intensity of (20-25) among the targets.

Sample No.6 A section of billet was cold worked to 75% deformation by cross rolling in directions 45° apart, and was then recrystallized at 565° C. for 45 minutes. The second deformation step included a cryogenic cross-rolling followed by a hot cross-rolling reduction. The cryogenic rolling comprised two perpendicular passes at −73° C., with 14% reduction (in reference to the finishing thickness of the cold rolling). The cryogenically rolled blank was subsequently soaked in a furnace at 510° C. for 30 minutes before the hot rolling, which did not result in significant recyrstallization. The hot rolling comprised two perpendicular passes at 310° C., with 12.6% reduction (in reference to the finishing thickness of the cold rolling), which brought about a 26.6% total amount of second deformation. The blank was then heat treated at 593° C. for 60 minutes for recrystallization. This target has a relatively high intensity of (11-20), but lower intensity of (20-25).

Table 2 also show the titanium purity of the samples: "5N5" indicates 99.9995 wt. % Ti; "5N8" indicates 99.9998 wt. % Ti; and "5N" indicates 99.999 wt. % Ti; all percentages exclude gases.

TABLE 1

Summary of Processes for Targets in Example Two

| Example | Process |
|---|---|
| No.1 | A section of billet ⇒ Cold cross-rolling 80% ⇒ Annealing at 760° C. for 75 minutes. |
| No.2 | A section of billet ⇒ Cold cross-rolling 80% ⇒ Annealing at 510° C. for 120 minutes. |
| No.3 | A section of billet ⇒ Primary deformation: cold cross-rolling 80%⇒ Annealing at 565° C. for 30 minutes⇒ Second deformation: cryogenic cross-rolling 15% at −73° C.⇒ Recovery annealing at 427° C. for 30 minutes. |
| No.4 | A section of billet ⇒ Primary deformation: cold cross-rolling 80%⇒ Annealing at 621° C. for 30 minutes⇒ Second deformation: cryogenic cross-rolling 15% at −73° C.⇒ Recrystallization annealing at 635° C. for 60 minutes. |
| No.5 | A section of billet ⇒ Primary deformation: cold cross-rolling 75%⇒ Annealing at 593° C. for 45 minutes⇒ Second deformation: cryogenic cross-rolling 14% at −48° C.⇒ Recrystallization annealing at 704° C. for 60 minutes. |
| No.6 | A section of billet ⇒ Primary deformation: cold cross-rolling 75%⇒ Annealing at 565° C. for 45 minutes⇒ Second deformation: cryogenic cross-rolling 14% at −73° C. ⇒ heat treatment at 510° C. for 30 minutes ⇒ cross-rolling 12.6% at 310° C. (total second deformation of 26.6%) Recrystallization annealing at 593° C. for 60 minutes. |

TABLE 2

Purity, Grain Size and Texture (times random).

|  | No. 1 | No. 2 | No. 3 | No. 4 | No. 5 | No. 6 |
|---|---|---|---|---|---|---|
| Metallic Purity | 5N5 | 5N8 | 5N | 5N | 5N | 5N |
| Grain Size (μm) | 75 | 14 | <10 * | 29 | 73 | 26 |
| (0002) tilt angle | 11° | 34° | 37° | 37° | 28° | 30° |
| (10-10) | 0.0 | 0.0 | 0.0 | 0.6 | 0.2 | 0.4 |
| (0002) | 5.5 | 2.5 | 1.3 | 0.4 | 0.4 | 1.3 |
| (10-11) | 0.0 | 0.0 | 0.0 | 0.0 | 0.2 | 0.0 |
| (10-12) | 1.4 | 1.2 | 1.6 | 2.3 | 1.8 | 1.0 |
| (10-13) | 2.7 | 6.2 | 2.2 | 2.9 | 3.0 | 2.6 |
| (10-15) | 7.3 | 5.5 | 2.3 | 1.1 | 2.9 | 3.8 |
| (10-17) | 10.0 | 5.5 | 1.8 | 0.8 | 1.3 | 2.3 |
| (11-20) | 0.0 | 0.1 | 1.8 | 1.4 | 0.6 | 0.9 |
| (20-25) | 2.3 | 3.2 | 2.5 | 3.5 | 3.3 | 2.6 |

*Twins in 95% area of grains.

TABLE 3

| Element | Concentration (ppm wt.) |
|---|---|
| Li | <0.005 |
| Be | <0.005 |
| B | <0.010 |
| F | <0.050 |
| Na | 0.020 |
| Mg | <0.010 |
| Al | 0.230 |
| Si | 0.130 |
| P | <0.010 |
| S | 6.000 |
| Cl | 0.030 |
| K | <0.010 |
| Ca | <0.200 |
| Sc | <0.050 |
| Ti | matrix |
| V | 1.600 |
| Cr | 0.130 |
| Mn | <0.005 |
| Fe | 2.000 |
| Co | <0.005 |
| Ni | 0.010 |
| Cu | <0.050 |
| Zn | <0.100 |
| Ga | <0.050 |
| Ge | <0.050 |
| As | <0.010 |
| Se | <0.010 |
| Br | <0.010 |
| Rb | <5.000 |
| Sr | <3000 |
| Y | <200 |
| Zr | 0.540 |
| Nb | <0.200 |
| Mo | <0.050 |
| Ru | <0.010 |
| Rh | <0.010 |
| Pd | <0.010 |
| Ag | <0.050 |
| Cd | <0.050 |
| In | <0.050 |
| Sn | <0.050 |
| Sb | <0.050 |
| Te | <0.050 |
| I | <0.010 |
| Cs | <0.010 |
| Ba | <0.005 |
| La | <0.005 |
| Ce | <0.005 |
| Nd | <0.005 |
| Hf | <0.050 |
| Ta | <1.000 |
| W | <0.010 |
| Re | <0.010 |
| Os | <0.010 |
| Ir | <0.010 |
| Pt | <0.050 |
| Au | <0.050 |
| Hg | 0.100 |
| Tl | <0.010 |
| Pb | <0.010 |
| Bi | <0.010 |
| Th | <0.0005 |
| U | <0.0005 |
| H | 3.050 |

TABLE 3-continued

| Element | Concentration (ppm wt.) |
|---|---|
| C | 7.000 |
| N | 3.000 |
| O | 70 |

TABLE 4

| Element | Concentration (ppm wt.) |
|---|---|
| Li | <0.005 |
| Be | <0.005 |
| B | <0.010 |
| F | <0.050 |
| Na | <0.010 |
| Mg | <0.050 |
| Al | 0.100 |
| Si | 0.100 |
| P | <0.010 |
| S | 1.000 |
| Cl | <0.010 |
| K | <0.010 |
| Ca | 0.400 |
| Sc | <0.050 |
| Ti | matrix |
| V | 0.550 |
| Cr | 0.068 |
| Mn | <0.005 |
| Fe | 2.100 |
| Co | 0.007 |
| Ni | 0.055 |
| Cu | <0.050 |
| Zn | <0.050 |
| Ga | <0.050 |
| Ge | <0.050 |
| As | <0.010 |
| Se | <0.050 |
| Br | <0.050 |
| Rb | <5.000 |
| Sr | <3000 |
| Y | <200 |
| Zr | <0.480 |
| Nb | <0.200 |
| Mo | <0.050 |
| Ru | <0.010 |
| Rh | <0.050 |
| Pd | <0.010 |
| Ag | <0.050 |
| Cd | <0.050 |
| In | <0.050 |
| Sn | <0.050 |
| Sb | <0.050 |
| Te | <0.050 |
| I | <0.010 |
| Cs | <0.010 |
| Ba | <0.005 |
| La | <0.005 |
| Ce | <0.005 |
| Nd | <0.005 |
| Hf | <0.010 |
| Ta | <5.000 |
| W | <0.010 |
| Re | <0.010 |
| Os | <0.010 |
| Ir | <0.010 |
| Pt | <0.050 |
| Au | <0.050 |
| Hg | <0.010 |
| Tl | 0.100 |
| Pb | <0.010 |
| Bi | <0.020 |
| Th | <0.0005 |
| U | <0.0005 |
| H | 1.000 |
| C | 5.000 |

TABLE 4-continued

| Element | Concentration (ppm wt.) |
|---|---|
| N | 2.000 |
| O | 79 |

TABLE 5

| Element | Concentration (ppm wt.) |
|---|---|
| Li | <0.005 |
| Be | <0.005 |
| B | <0.010 |
| F | <0.050 |
| Na | 0.010 |
| Mg | <0.050 |
| Al | 0.200 |
| Si | 0.230 |
| P | <0.010 |
| S | 4.000 |
| Cl | 0.005 |
| K | <0.010 |
| Ca | <0.500 |
| Sc | <0.050 |
| Ti | matrix |
| V | 0.660 |
| Cr | 0.070 |
| Mn | <0.005 |
| Fe | 8.800 |
| Co | <0.010 |
| Ni | 0.010 |
| Cu | <0.050 |
| Zn | <0.050 |
| Ga | <0.050 |
| Ge | <0.050 |
| As | <0.010 |
| Se | <0.050 |
| Br | <0.050 |
| Rb | <5.000 |
| Sr | <3000 |
| Y | <200 |
| Zr | 0.370 |
| Nb | <0.200 |
| Mo | <0.050 |
| Ru | <0.010 |
| Rh | <0.050 |
| Pd | <0.010 |
| Ag | <0.050 |
| Cd | <0.050 |
| In | <0.050 |
| Sn | <0.050 |
| Sb | <0.050 |
| Te | <0.050 |
| I | <0.010 |
| Cs | <0.010 |
| Ba | <0.005 |
| La | <0.005 |
| Ce | <0.005 |
| Nd | <0.005 |
| Hf | <0.010 |
| Ta | <5.000 |
| W | <0.010 |
| Re | <0.010 |
| Os | <0.010 |
| Ir | <0.010 |
| Pt | <0.050 |
| Au | <0.050 |
| Hg | 0.100 |
| Tl | <0.010 |
| Pb | <0.010 |
| Bi | <0.020 |
| Th | <0.0005 |
| U | <0.0005 |
| H | 2.000 |
| C | 19.000 |
| N | 2.000 |
| O | 228 |

TABLE 6

| Element | Concentration (ppm wt.) |
|---|---|
| Li | <0.005 |
| Be | <0.005 |
| B | <0.010 |
| F | <0.050 |
| Na | 0.010 |
| Mg | <0.050 |
| Al | 1.300 |
| Si | 0.380 |
| P | <0.010 |
| S | 0.700 |
| Cl | 0.01 |
| K | <0.010 |
| Ca | 0.400 |
| Sc | <0.050 |
| Ti | matrix |
| V | 0.190 |
| Cr | 0.180 |
| Mn | <0.005 |
| Fe | 3.800 |
| Co | 0.005 |
| Ni | 0.030 |
| Cu | 0.170 |
| Zn | <0.050 |
| Ga | <0.050 |
| Ge | <0.050 |
| As | <0.010 |
| Se | <0.050 |
| Br | <0.050 |
| Rb | <5.000 |
| Sr | <3000 |
| Y | <200 |
| Zr | 0.420 |
| Nb | <0.200 |
| Mo | <0.050 |
| Ru | <0.010 |
| Rh | <0.050 |
| Pd | <0.010 |
| Ag | <0.050 |
| Cd | <0.050 |
| In | <0.050 |
| Sn | <0.050 |
| Sb | <0.050 |
| Te | <0.050 |
| I | <0.010 |
| Cs | <0.010 |
| Ba | <0.005 |
| La | <0.005 |
| Ce | <0.005 |
| Pr | <0.005 |
| Nd | <0.005 |
| Sm | <0.005 |
| Eu | <0.005 |
| Gd | <0.005 |
| Tb | <0.005 |
| Dy | <0.005 |
| Ho | <0.005 |
| Er | <0.005 |
| Tm | <0.005 |
| Yb | <0.005 |
| Lu | <0.005 |
| Hf | <0.010 |
| Ta | 5000 |
| W | <0.010 |
| Re | <0.010 |
| Os | <0.010 |
| Ir | <0.010 |
| Pt | <0.050 |
| Au | <0.050 |
| Hg | <0.100 |
| Tl | <0.010 |
| Pb | <0.010 |
| Bi | <0.020 |
| Th | <0.0005 |
| U | <0.0005 |

As shown in Table 7, target No.1 which has strongest (0002) intensity has lowest step coverage. Target No.2 provide slightly higher step coverage than target No.1. Since both target No.1 and No.2 have negligible (11-20) intensity, the slightly improved step coverage associated with target No.2 should be a result of reduced (0002) and increased intensity in the vicinity of (20-25). Further step coverage improvement can be achieved by increasing intensity of (11-20) and further decreasing intensity of (0002) as shown by targets No. 3 through No. 6. Statistical analysis showed that the differences in step coverage are indeed from texture effects. It should be noted, however, that step coverage is dependent on sputter system and configuration of sputtering. Therefore, greater or smaller step coverage improvement may occur on a different sputter system or different configuration of sputtering.

TABLE 7

| | Sputtering Performance | | | | | |
|---|---|---|---|---|---|---|
| Aspect Ratio | No. 1 | No. 2 | No. 3 | No. 4 | No. 5 | No. 6 |
| 1.00 | 0.235 | 0.240 | 0.255 | 0.256 | 0.251 | 0.259 |
| 1.39 | 0.152 | 0.159 | 0.168 | 0.164 | 0.163 | 0.168 |
| 1.78 | 0.105 | 0.108 | 0.114 | 0.116 | 0.111 | 0.111 |
| 2.21 | 0.073 | 0.076 | 0.081 | 0.078 | 0.079 | 0.082 |
| 2.56 | 0.058 | 0.060 | 0.065 | 0.062 | 0.064 | 0.068 |
| Mean Step Coverage | 0.125 | 0.129 | 0.137 | 0.135 | 0.134 | 0.138 |

It is apparent from the foregoing that various changes and modifications may be made without departing from the invention. Accordingly, the invention should be limited only by the appended claims.

What is claimed is:

1. A film of titanium over a substrate wherein the film is deposited by sputtering from a target having a target plane in which the total intensity of (20-25) plane plus (11-20) plane that are parallel to the target plane is greater than 4.1 times random, and the intensity of (20-25) plane is at least 1.5 times random.

2. A film of titanium according to claim 1 wherein no metallic impurity exceeds 0.2 parts per million.

3. A film of titanium according to claim 1 comprising at least 99.999% titanium, excluding gases.

4. The film according to claim 1 wherein the substrate is a semiconductor substrate.

5. A film of titanium on a substrate wherein the film is deposited by sputtering from a target having a target plane with a recrystalized microstructure and the intensity of (11-20) plane parallel to the target plane is equal or greater than 0.4 times random and the intensity of (20-25) plane is at least 1.5 times random.

6. The film according to claim 5 wherein the substrate is a semiconductor substrate.

7. A film of titanium over a substrate wherein the film is deposited by sputtering from a target having a target plane with a recrystalized microstructure and a texture: (a) with intensity of (11-20) plane parallel to the target plane greater than 0.4 times random; (b) intensity summation of planes (20-25), (10-13), and (10-12) that are parallel to the target plane greater than five times random.

8. A film of titanium according to claim 7 comprising at least 99.995% titanium, excluding gases.

9. The film according to claim 7 wherein the substrate is a semiconductor substrate.

10. A film of titanium over a substrate wherein the film is deposited by sputtering from a target having at least about 70% area of twinned grains in the microstructure and a texture where the intensity of (11-20) plane parallel to the surface of the target is greater than one times random.

11. A film of titanium according to claim 10 comprising at least about 99.995% titanium, excluding gases.

12. A film of titanium according to claim 10 comprising at least about 99.999% titanium, excluding gases.

13. The film according to claim 10 wherein the substrate is a semiconductor substrate.

14. A film of titanium on a semiconductor substrate, comprising:

titanium deposited by sputtering from a target having an intensity of (0002) plane parallel to the surface of the target of less than 1.8 times random; the semiconductor substrate having at least one opening having an aspect ratio of greater than 1.3, the film having a step coverage of at least 0.163 in the at least one opening, the aspect ratio of greater than 1.3 being higher than a corresponding aspect ratio obtained under identical sputtering conditions utilizing a target having a greater intensity of (0002).

* * * * *

UNITED STATES PATENT AND TRADEMARK OFFICE
CERTIFICATE OF CORRECTION

PATENT NO. : 6,509,102 B1
DATED : January 21, 2003
INVENTOR(S) : Yinshi Liu

It is certified that error appears in the above-identified patent and that said Letters Patent is hereby corrected as shown below:

<u>Title page,</u>
Item [54], Title, please delete "FILM" and insert -- FILMS --.

<u>Column 2,</u>
Line 26, please delete "." after "produced" and insert -- , --.
Line 38, please insert -- and titanium materials having less than 20 parts per million oxygen --.
Line 64, please delete "step coverage" before "which" and insert -- "step coverage" --.

<u>Column 3,</u>
Line 62, please delete "With" before "short" and insert -- with --.
Line 62, please delete "show" after "as" and insert -- shown --.

<u>Column 5,</u>
Line 59, please delete "a" after "of" and insert -- α --.
Line 66, please delete "ith" after "for" and insert -- its --.

<u>Column 7,</u>
Line 25, please delete "deformation" after "term" and insert -- "deformation" --.
Line 39, please delete "1" after "subscript" and insert -- "1" --.
Line 60, please delete "." after "temperature".

<u>Column 8,</u>
Line 26, please delete "a" after "change" and insert -- α --.

<u>Column 9,</u>
Line 29, please delete "purities. Grin" after "summarizes" and insert -- purities, grain --.

UNITED STATES PATENT AND TRADEMARK OFFICE
CERTIFICATE OF CORRECTION

PATENT NO. : 6,509,102 B1
DATED : January 21, 2003
INVENTOR(S) : Yinshi Liu

It is certified that error appears in the above-identified patent and that said Letters Patent is hereby corrected as shown below:

Column 10,
Line 30, please insert -- : -- after "5".
Line 43, please insert -- : -- after "6".

Column 16,
Line 1, please delete "provide" before "slightly" and insert -- provides --.

Signed and Sealed this

Fifth Day of August, 2003

JAMES E. ROGAN
*Director of the United States Patent and Trademark Office*